United States Patent [19]

Modafferi

[11] Patent Number: 4,918,394
[45] Date of Patent: Apr. 17, 1990

[54] AUDIO FREQUENCY POWER AMPLIFIER WITH IMPROVED CIRCUIT TOPOLOGY

[75] Inventor: Richard Modafferi, Vestal, N.Y.

[73] Assignee: Modafferi Acoustical Systems, Ltd., Baldwin, N.Y.

[21] Appl. No.: 328,110

[22] Filed: Mar. 23, 1989

[51] Int. Cl.$^4$ ............................................... H03F 5/00
[52] U.S. Cl. .......................................... 330/3; 330/97; 330/118
[58] Field of Search ................. 330/3, 84, 91, 97, 116, 330/117, 118, 124 R, 148

[56] References Cited

U.S. PATENT DOCUMENTS 3,094,673  6/1963  Maupin .................................... 330/3

OTHER PUBLICATIONS

Horowitz, "Phase Inverters for Hi-Fi Amplifiers," *Radio & TV News*, May, 1957, pp. 92-97.
Hafler, "120 Watts of Hi-Fi Power," *Radio & TV News*, Feb., 1959, pp. 118-120.
Hafler, "A 60-Watt Ultra Linear Amplifier," *Radio & Television News*, Feb., 1955, pp. 45-et seq.
Peters, "In Defense of the Split-Load Phase Inverter," *Radio -TV News*, Nov., 1957, pp. 182-184.
M. Joyce and K. Clarke, *Transistor Circuit Analysis*, pp. 52-61.
Radiotron Designer's Handbook (2 Langford-Smith ed. 1953), pp. 328-330, 533-534.
Photofact Folder, showing David Bogen Model K030 Amplifier.
RCA Tube Manual (1970 ed.), p. 607.

*Primary Examiner*—Steven Mottola
*Attorney, Agent, or Firm*—John F. A. Earley; John F. A. Earley, III; P. Michael Walker

[57] ABSTRACT

The present invention is an audio frequency power amplifier input circuit having improved vacuum tube circuit topology. The improved circuit includes a direct current feedback circuit within the input circuitry which stabilizes the operating point of a phase inverter. The feedback circuit maintains optimum operation of the circuit despite variations in tube characteristics or supply voltages. Another aspect of the improved circuit comprises a low impedance phase inverter which improves the drive capability of the phase inverter to push-pull power output vacuum-tube grids.

13 Claims, 4 Drawing Sheets

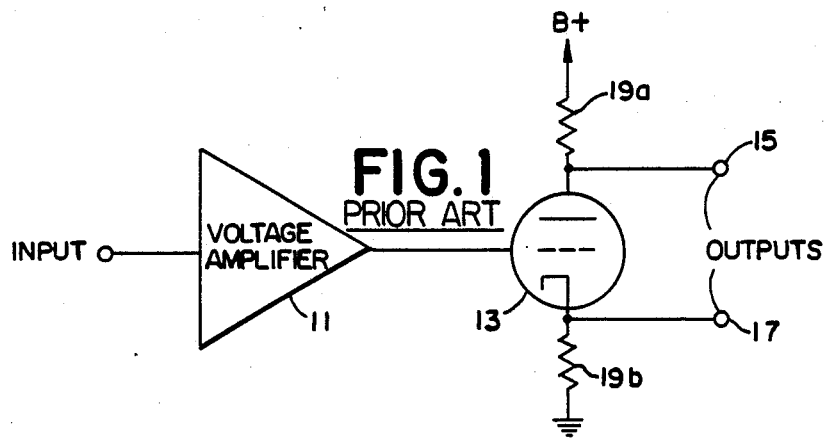
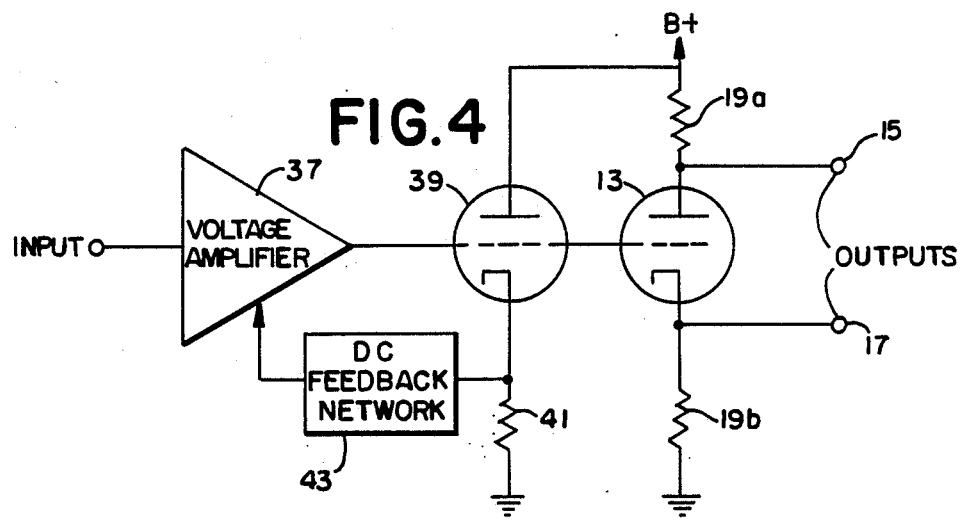
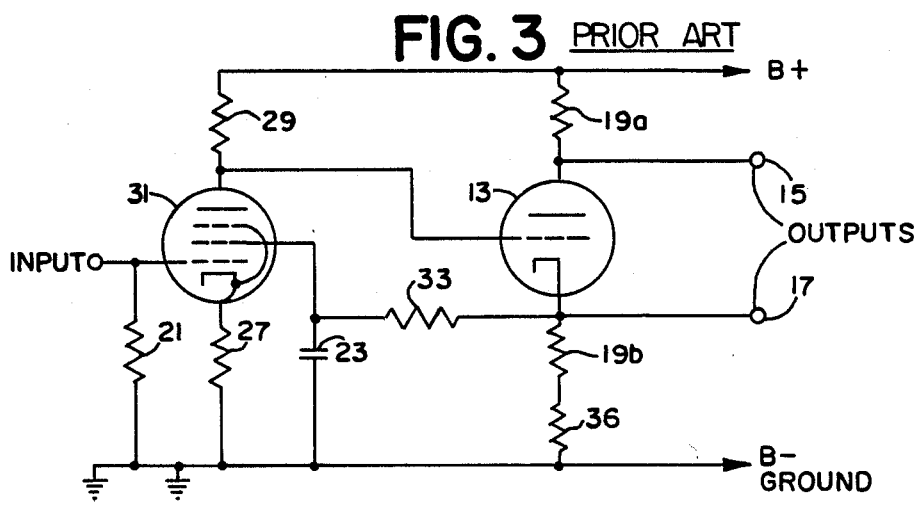

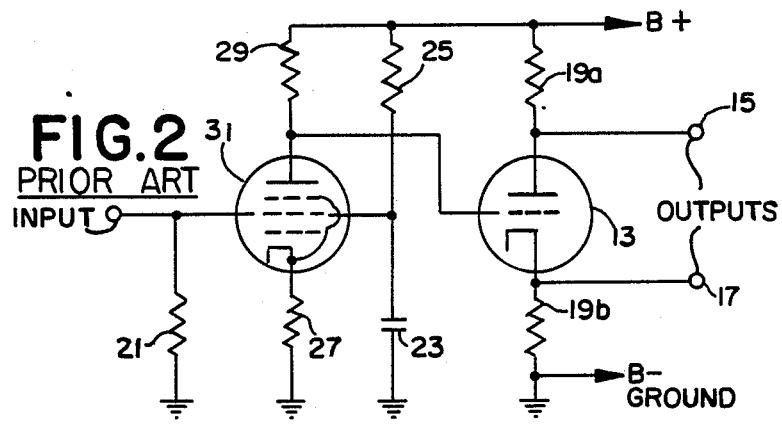
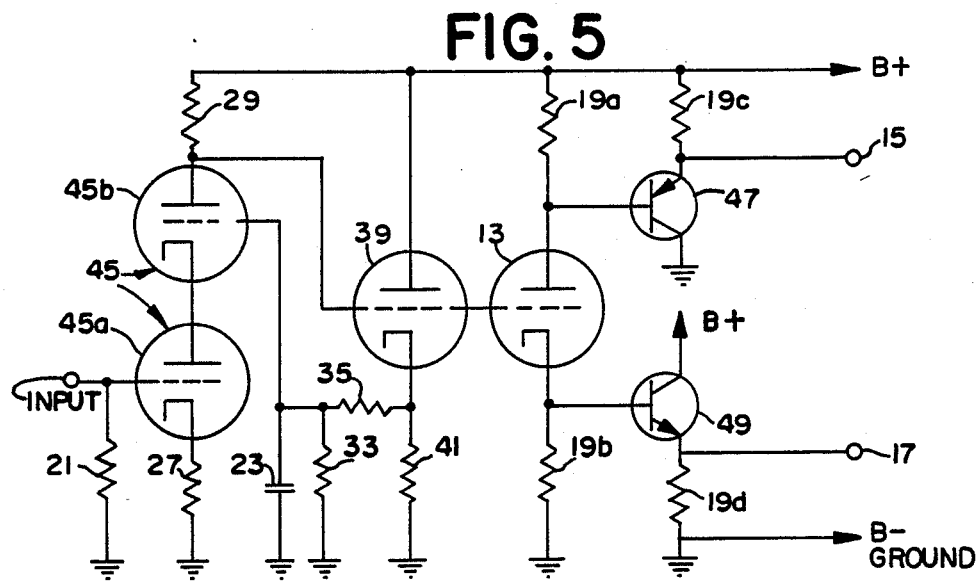
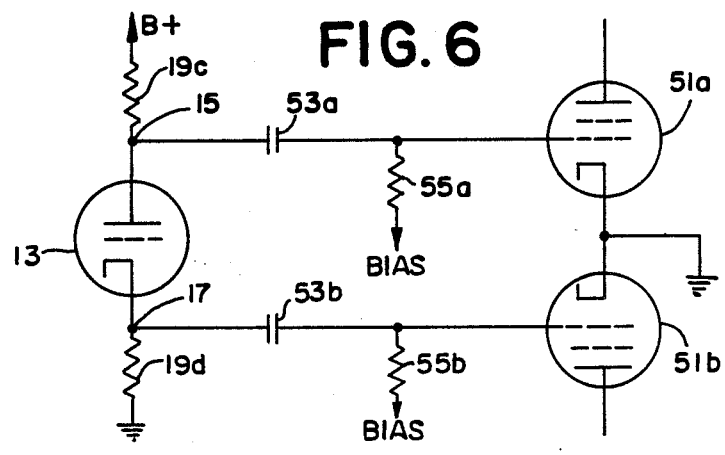

AUDIO FREQUENCY POWER AMPLIFIER WITH IMPROVED CIRCUIT TOPOLOGY

BACKGROUND OF THE INVENTION

1. Field of the Invention

This invention relates to improvements in vacuum-tube audio power amplifier circuit topology.

2. Description of the Prior Art

Examples of prior art audio power amplifiers are the amplifiers described in Hafler, 120 *Watts of Hi-Fi Power*, Radio & TV News, February 1959, pages 118–120, and Hafler, *A 60-Watt "Ultra-Linear Amplifier"*, Radio & TV News, February 1955, page 45 et seq.

The problem with audio power amplifiers using the prior art circuit topology described in these references is that they possess certain performance deficiencies. Firstly, the direct-coupled voltage amplifier-phase inverter input circuit has poor current stability, so that variations in tube characteristics or tube supply voltages affect performance. Secondly, the phase inverter stage has limited drive capability to the power amplifier output stage, which results in higher distortion and less than optimum power output. The present invention overcomes these difficulties by utilizing a novel input circuit topology incorporating direct current feedback. Also included in the invention input circuit is a low impedance phase inverter having enhanced drive capability. The higher drive capability reduces distortion and also yields a higher power output by ensuring adequate drive power to the push-pull output stage.

A typical prior art input circuit partial schematic diagram is shown in FIG. 1. The voltage amplifier 11 is a triode, or pentode, vacuum tube operated as a high-gain voltage amplifier. The triode vacuum tube 13 is a well known split-load phase inverter, which has outputs of equal voltage but opposite phase at terminals 15 and 17.

FIG. 2 is a more detailed schematic diagram of a prior art input circuit. Resistor 21 is a grid leak resistor. The capacitor 23 is a bypass capacitor with reactance at least one order of magnitude lower than the resistance of screen-grid resistor 25 at the lowest audio frequency of 20 Hz. Resistors 25, 27, and 29 determine the direct current operating point for tubes 13 and 31. This operating point is generally set so as to cause the no-signal direct current voltage drops across tube 13 and both resistors 19a, 19b to be approximately equal. Stated another way, the voltage drop across each resistor 19a, 19b is equal to one-half the voltage drop across tube 13. As is well understood by those skilled in the art, this ensures maximum output voltage at the phase inverter output terminals 15 and 17.

Since no direct current feedback is employed from tube 13 to tube 31 in the circuit of FIG. 2, the direct current operating point of the circuit depends on the characteristics of pentode vacuum tube 31 and triode vacuum tube 13, as well as on the values of resistors 25, 27, and 29. The resistance values of resistors 25, 27 and 29 generally remain stable over time, but the characteristics of the tubes change with age. The aging causes a random drift of the direct current operating point of the circuit as the tubes age. The direct current operating point also drifts if filament or plate power supply voltages change, since a change in either aforementioned power supply voltage affects tube characteristics. Thus, the optimum operating point of the circuit would occur only by accident; usually an error exists which is sufficiently large to reduce circuit performance to less than optimum.

Another prior-art amplifier input circuit is shown in FIG. 3. This circuit differs from that shown in FIG. 2 because the circuit in FIG. 3 has the screen grid of pentode 31 connected through resistor 33 to the cathode of phase inverter tube 13 instead of to the B+ supply.

Resistor 21 is a grid leak resistor, capacitor 23 is a bypass capacitor with reactance at least one order of magnitude lower than the resistance of screen grid resistor 33 at the lowest audio frequency of 20 Hz. Resistors 27, 29 and 33 determine the direct current operating point for tubes 31 and 13. This operating point is generally set so as to cause the no signal direct current voltage across tube 13 and the sum of the direct current voltages across the two resistors 19a, 19b to be approximately equal Direct current feedback from tube 13 to tube 31 is accomplished by connecting resistor 33 between the screen grid of 31 and the cathode of 13. Since this feedback connection unbalances the phase inverter outputs, a resistor 36 is added in series with the cathode load resistor 19b to compensate for the unbalance.

The mode of operation for the direct current feedback is explained hereinafter in the description of the preferred embodiments. Also explained is an improved means whereby the present invention overcomes the phase inverter unbalance problem of the prior art circuit of FIG. 3.

SUMMARY OF THE INVENTION

The present invention is an audio frequency power amplifier input circuit. The circuit employs a split load phase inverter to provide outputs of equal voltage but opposite phase at its output terminals. In order to stabilize the direct current operating point against variations in tube characteristics or supply voltages, the present invention employs a direct current feedback circuit to the voltage amplifier circuit which normally feeds the signals to the split load phase inverter. In addition, the present invention employs two transistor emitter-follower circuits which enhance the drive capability of the phase inverter. The foregoing mentioned higher drive capacity reduces distortion and also yields a higher power output by ensuring adequate drive power to a push-pull output stage.

BRIEF DESCRIPTION OF THE DRAWINGS

FIG. 1 is a schematic diagram of a prior art voltage amplifier and phase inverter;

FIG. 2 is a schematic diagram of a prior art voltage amplifier and phase inverter;

FIG. 3 is a schematic diagram of another prior art voltage amplifier and phase inverter;

FIG. 4 is a schematic diagram of a voltage amplifier and phase inverter of the invention;

Figure 7:
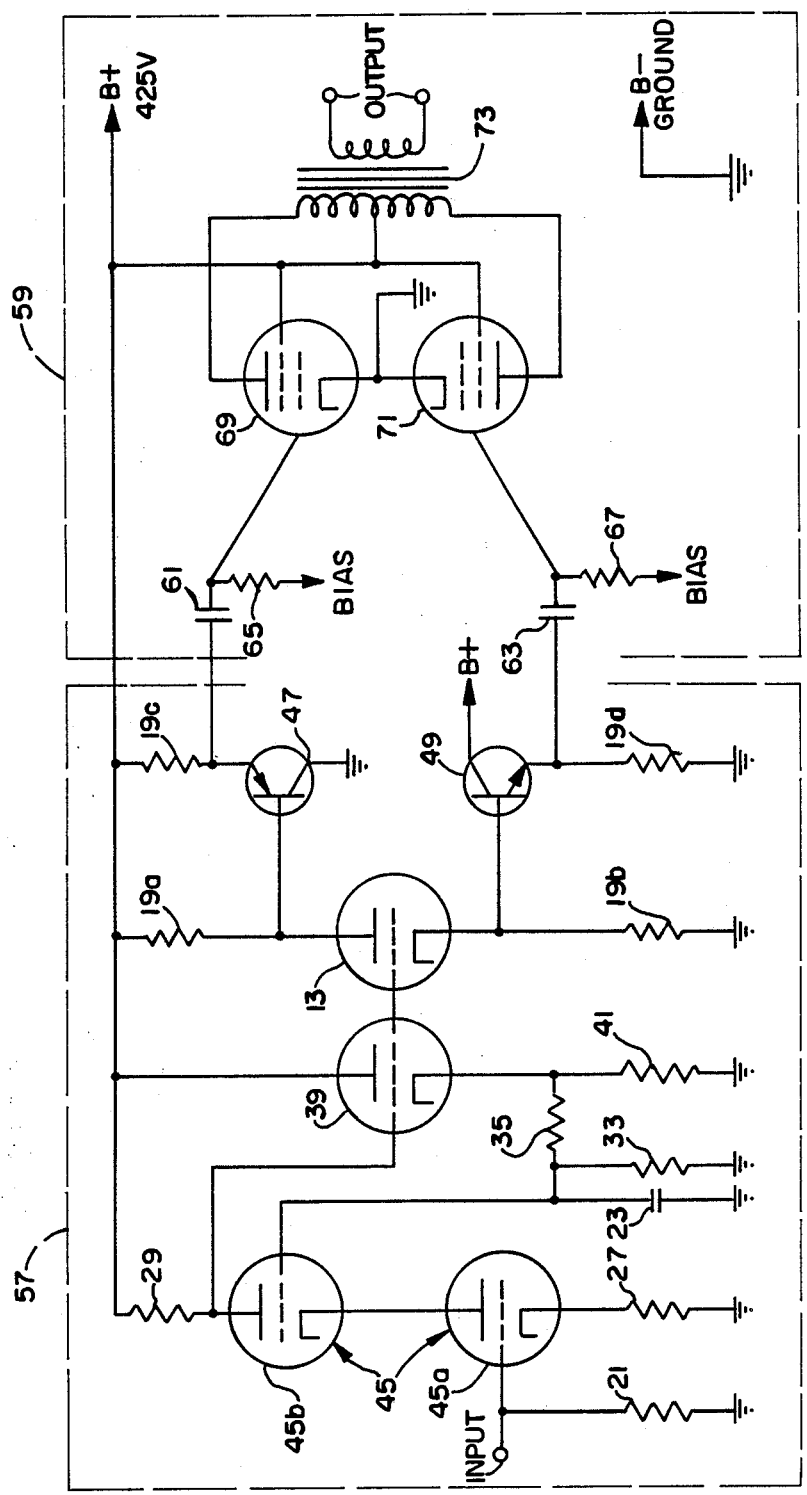
Figure 8:
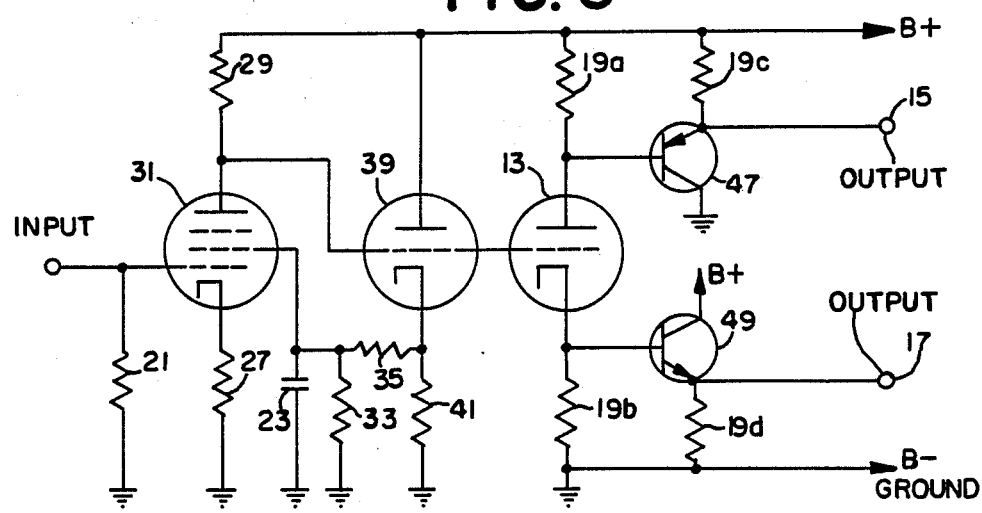
Figure 9:
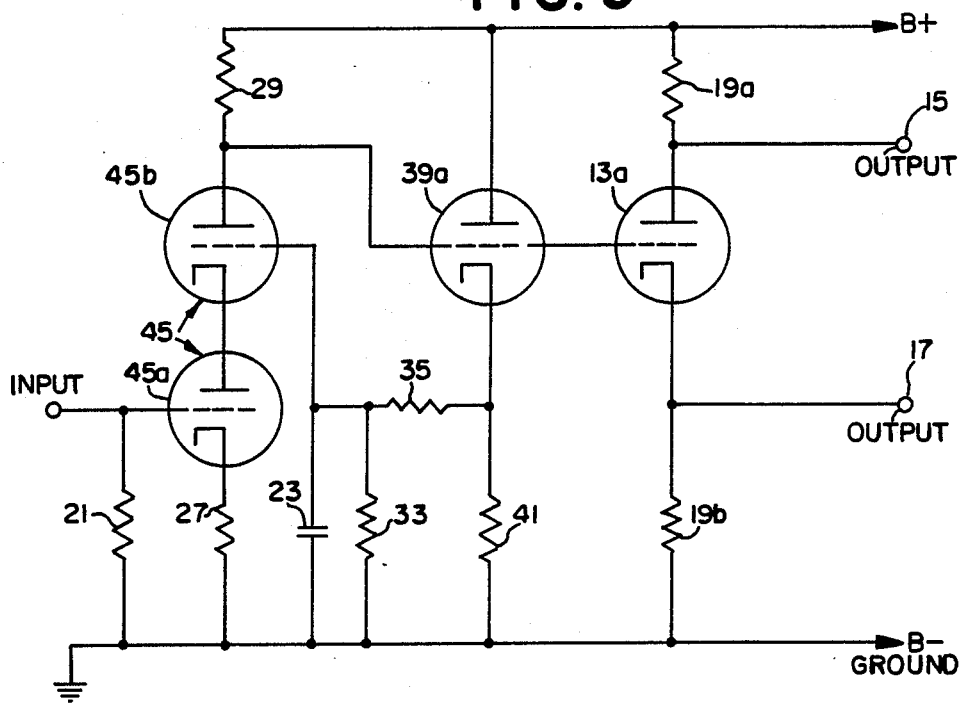

5 is a detailed schematic diagram of the present voltage amplifier and phase inverter of the invention;

FIG. 6 is a schematic diagram of a split-load phase inverter connected to a load;

FIG. 7 is a schematic diagram of the signal-handling portion of a power amplifier;

FIG. 8 is a schematic diagram of another embodiment of the voltage amplifier and phase inverter of the invention; and FIG. 9 is a schematic diagram of another embodiment of the voltage amplifier and phase inverter of the invention.

DETAILED DESCRIPTION OF THE PREFERRED EMBODIMENT

Consider FIG. 4. FIG. 4 depicts a version of the present invention. A high gain triode cascade or pentode voltage amplifier 37 is connected to two triode vacuum tubes 13 and 39. Triode 13 functions as a split-load phase inverter, while triode 39 functions as a cathode follower. Voltage across resistor 41, connected to cathode follower 39, is applied through a feedback network 43 to voltage amplifier 37.

A more detailed input circuit embodiment is shown schematically in FIG. 5. Dual triode vacuum tube 45 is connected as the well-known cascode circuit with triode section 45a functioning as a grounded-cathode first stage directly coupled to triode section 45b functioning as a grounded-grid second stage. The cascode circuit has a high gain-bandwidth product as well as low noise and distortion, well-known to those skilled in the art.

Resistor 21 is a grid-leak resistor. Capacitor 23 is a bypass capacitor with reactance at least an order of magnitude lower than the effective combined resistance to ground of resistors 33, 35 and 41 at the lowest audio frequency of 20 Hz. Cascode voltage amplifier 45 is direct-coupled to the grids of triode cathode-follower 39 and triode split-load phase inverter 13. Cathode follower 39 develops a voltage across resistor 41 which also appears across voltage divider resistors 33 and 35. The junction of resistor divider 33 and 35 is connected to the grid of cascode triode 45b. The direct current operating point of the entire circuit is set by the respective values of resistors 27, 29, 33, 35 and 41. As explained hereinbefore, in order to secure maximum output voltage from the phase inverter, the direct current operating point is adjusted so that the no-signal direct current voltage drops across phase inverter tube 13 and both equal-value load resistors 19a, 19b are approximately equal.

Feedback from triode 39 through resistor divider 33–35 to triode 45b serves to stabilize the direct current operating point against variations in tube characteristics or power supply voltages. As an illustrative example, assume that as tube 45 ages its transconductance drops. This causes the plate current to drop making the voltage at the plate of triode 45b rise. The voltage at the cathode of cathode follower 39 also rises, and so the voltage rises across the divider made up of resistors 33 and 35. Thus, the voltage on the grid of triode 45b rises. This increased bias on the grid of 45b increases the plate current in triode 45, restoring circuit operation near to its original direct current operating point. Other variations in tube characteristics or power supply voltages which would tend to upset the optimum direct current operating point of the circuit are corrected by the feedback in a similar manner. The direct current feedback employed in the invention embodiment of FIG. 5 tends to maintain the direct current operating point of the amplifier input circuit close to the optimum as tubes age or power supply voltages change.

Transistors 47 and 49 serve to isolate the load connected to terminals 15 and 17 from phase inverter tube 13. The split-load phase inverter 13 has radically different output impedances at each of its output terminals. Referring to FIG. 4 the output impedance at terminal 15 is given by:

$$Z_o = (\mu - 1)R, \quad (1)$$

where $Z_o$ is the output impedance, $\mu$ is the amplification factor for a triode vacuum tube, and R is the resistance of resistors 19a, 19b shown in FIG. 4. The output impedance at terminal 17 is given by:

$$Z_o = (r_p + R)/(\mu + 1), \quad (2)$$

where $r_p$ is the plate resistance. For a typical triode such as the commonly used type 12AU7 having $$\mu = 20$$

$$r_p = 15 \text{ kilohms}$$

with load resistor R equal to 33 kilohms, equation (1) yields a value of output impedance at terminal 15 of:

$$Z_o = (20-1)33 = 627 \text{ kilohms},$$

and equation 1 yields a value of output impedance at terminal 17 of:

$$Z_o = (15000 + 33000)/(20 + 1) = 2300 \text{ ohms}.$$

Optimum function of the split-load phase inverter requires a load as seen at terminals 15 and 17 of at least an order of magnitude higher than the highest output impedance of the phase inverter itself, i.e., higher than the output impedance of terminal 15.

In typical amplifier circuits the load seen by the phase inverter will amount to about 100 kilohms. This load condition is illustrated in FIG. 6. The plate and cathode of split-load phase inverter 13 are alternating current coupled to each respective grid of output tubes 51a, 51b via blocking capacitors 53a, 53b. The load seen by the phase inverter output terminals 15 and 17 consists of grid-bias resistors 55a and 55b in combination with the input resistance and reactance of output tubes 51a, 51b. As explained immediately hereinbefore, this phase inverter load impedance value is about 100 kilohms in typical amplifier circuits.

The 100 kilohm load at the output tube grids is lower than the output impedance of the phase inverter terminal 15 calculated hereinbefore as $$Z_o = 627 \text{ kilohms},$$

while terminal 17 has an output impedance of $$Z_o = 2300 \text{ ohms},$$

much lower than the typical 100 kilohm load stated hereinbefore. Thus the phase inverter 13 easily drives its load from terminal 17 but is less able to drive its load from terminal 15. Distortion is increased and maximum output voltage is reduced at terminal 15 with respect to terminal 17. Thus the phase inverter becomes unbalanced. Performance would be improved if the output impedance at phase inverter output terminals 15 and 17 could be lowered.

Transistor emitter followers connected to the phase inverter plate and cathode provide the desired lower output impedances. Referring to FIG. 5, the output impedance of the phase inverter at terminal 15 with the emitter follower is given by:

$$Z_o \approx R(1-a) \quad (3)$$

where R is the output impedance of the phase inverter without emitter follower as calculated earlier;

627 kilohms, and a is the common-base current gain of the transistor, typically $$a = 0.98$$

yielding an output impedance at terminal 15 of the circuit in FIG. 5, using equation (3) of:

$$Z_c \approx 627(1-0.98) = 12.5 \text{ kilohms.}$$

Similar calculations for terminal 17 yield $$Z_c \approx 2300(1-0.98) = 46 \text{ ohms.}$$

Output impedances at terminals 15 and 17 are still not equal, but with the emitter-follower are now both lower by at least approximately one order of magnitude than the load impedance of 100 kilohms.

Transistors used as emitter followers in the invention embodiment of FIG. 5 should have a common-base current gain of 0.98 or higher, corresponding to a common-emitter current gain of 50 or higher. This condition is met by many commonly available transistors, especially those of the so-called "darlington" type. Current gain of the emitter-follower should be relatively high so that the load presented by the transistor at the plate of phase splitter 13 is of high impedance. This load should be greater in impedance than the value of 627 kilohms calculated earlier at terminal 15.

The load presented by the transistor emitter follower to the plate of tube 13 in the circuit of FIG. 5 is given by:

$$Z \approx (B+1)R \quad (4)$$

Where B is the common-emitter current gain of the transistor and R is the emitter load resistor. With B=50 and R=33 kilohms this yields $$Z \approx (50+1)33 = 1683 \text{ kilohms}$$

which is a much higher value of load impedance than the value of 627 kilohms calculated hereinbefore for terminal 15 of the circuit in FIG. 6.

Those skilled in the art will recognize that a vacuum-tube cathode follower could be substituted for the transistor emitter follower of FIG. 5. However, the vacuum-tube cathode follower offers little advantage and it results in a circuit having greater complexity Other substitutions are possible. For example, field-effect transistors could be substituted for the bipolar transistors used in the invention embodiment of FIG. 5.

It should be clear also to those skilled in the art that a pentode vacuum tube could be substituted for the dual-triode cascode vacuum tube used in the invention embodiment of FIG. 5. FIG. 8 shows an embodiment of the invention where a pentode has been substituted for the dual triode of the circuit shown in FIG. 5.

Turning now to FIG. 8, resistor 21 is a grid leak resistor, capacitor 23 is a bypass capacitor with reactance at least one order of magnitude lower than the combined resistance of resistors 33, 35 and 41 at the lowest audio frequency of 20 Hz. Resistors 27, 29, 33, 35 and 41 determine the direct current operating point for tubes 31 and 13. This operating point is generally set so as to cause the no-signal direct current voltage drops across tube 13 and both resistors 19a, 19b to be approximately equal.

Feedback from triode 39 through resistor divider 33-35 to the screen grid of pentode 31 stabilizes the direct current operating point against variations in tube characteristics or power supply voltages. As an example, assume that as tube 31 ages, its transconductance drops. This causes the plate current to drop, which makes the voltage at the plate of tube 31 rise. The voltage at the cathode of cathode follower 39 also rises and hence the voltage rises across divider 33-35. As a result, the voltage on the screen of pentode 31 rises, which increases the plate current in pentode 31 and restores circuit operation to near its original operating point.

The direct current feedback in the embodiment of the invention in FIG. 8 stabilizes the circuit direct current operating point just as the embodiment of the invention in FIG. 5 stabilizes the circuit direct current operating point.

The embodiment of FIG. 8 overcomes a problem inherent in the prior art circuit of FIG. 3. Feedback in the circuit of FIG. 3 is take directly from the phase inverter cathode. Screen current flows to pentode 31 through feedback resistor 33 and unbalances the signal output at the phase inverter cathode, which causes distortion. Resistor 36 is added in series with cathode resistor 19b to attempt to compensate for this unbalance. However, the screen current of tube 31 varies with the signal, which makes compensation impossible under dynamic conditions. Hence, the screen current to tube 31 still unbalances the phase inverter sufficiently so as to increase distortion.

The present invention overcomes this problem in the prior art by using a separate cathode follower, tube 39 in FIG. 8, which supplies the direct current feedback allowing phase inverter 13 to supply output signal exclusively. Since the functions of direct current feedback and phase inversion are separated in the invention of FIG. 8, the full benefit of the direct current feedback may be realized.

FIG. 7 is a partial schematic diagram of an audio power amplifier embodying the input circuit of the invention. Amplifier circuit of FIG. 7 is a combination of input circuit 57 of FIG. 5, which is the preferred embodiment of the invention, with an output circuit 59, which is a conventional prior art push-pull power output stage. The output circuit 59 of FIG. 7 includes coupling capacitors 61, 63, grid leak resistors 65, 67, output tubes 69, 71 and a transformer 73. Transformer 73 is connected to a load, such as a loudspeaker. Not shown in the schematic diagram of FIG. 7 are feedback networks and power supplies, which are conventional and in the prior art.

By way of illustration and not limitation, the component values used in FIGS. 1 through 9 are given as follows:

| Resistors | |
|---|---|
| Resistor 21 | 560 kilohms |
| Resistor 29 | 150 kilohms |
| Resistor 27 | 270 ohms |
| Resistor 33 | 180 kilohms |
| Resistor 35 | 560 kilohms |
| Resistor 36 | 1000 ohms (FIG. 3) |

| -continued | |
|---|---|
| Resistor 41 | 100 kilohms |
| Resistor 65 | 150 kilohms |
| Resistor 67 | 150 kilohms |
| Resistors 19 a–d | 33 kilohms |
| Resistors 55 a,b | 150 kilohms |
| Capacitors | |
| 23 | 1.0 microfarads |
| 61 | 0.22 microfarads |
| 63 | 0.22 microfarads |
| 53 a, b | 0.22 microfarads |
| Transistors | |
| 47 | ECG-38 |
| 49 | ECG-175 |
| Tubes | |
| 31 | 6AU6 (FIGS. 2 and 3) |
| 45 a, 45 b | 12AU7 |
| 13 | 12AU7 |
| 39 | 12AU7 |
| 69 | 6CA7 |
| 71 | 6CA7 |

Another preferred embodiment of the invention is shown schematically in FIG. 9. It has higher voltage drive capability than the embodiment of FIG. 5 an finds application in very high power amplifiers having output tubes which require large grid drive voltages. Available transistors limit the B+ supply voltage in the circuit of FIG. 5 to a maximum of 450 volts yielding a maximum peak-to-peak output at voltage terminals 15 and 17 of 100 volts The circuit of FIG. 9 may operate with a supply voltage as high as 600 volts which yields a higher maximum peak-to-peak output voltage at terminals 15 and 17 of 150 volts.

Tubes 39a and 13a of FIG. 9 are of a class of dual triodes originally developed for application in the vertical sweep circuits of television receivers. These tubes find application here because triode 13a has the special characteristics of low amplification factor and low plate resistance that allow design of a split-load phase inverter having low output impedance and eliminates the need for the drive transistors 47, 49 used in the circuit of FIG. 5. Tubes 39a, 13a have a higher current capability and can drive the output stage of the circuit directly, without transistors 47, 49.

Television vertical deflection tube type "6EM7" has characteristics for its triode section No. 2, which becomes triode 13a of FIG. 9, of:

$$\mu = 5.4$$

$$r_p = 1000 \text{ ohms}$$

with load resistors 19a, 19b equal to 10 kilohms, equation (1) yields a value of output impedance at terminal 15 of $$Z_o = (\mu - 1)R$$

$$Z_o = (5.4 - 1)10 = 44 \text{ kilohms,}$$

and equation (2) yields a value of output impedance at terminal 17 of $$Z_o = (r_p + R)/(\mu + 1)$$

$$Z_o = (1 + 10)/(5.4 + 1) = 1700 \text{ ohms.}$$

As calculated hereinbefore for the invention embodiment of FIG. 5, the phase inverter output impedances at terminals 15 and 17 are unequal. The highest of the two values is 44 kilohms. While the 44 kilohm output impedance is not as low as the value of 12.5 kilohms calculated hereinbefore for the invention embodiment of FIG. 5, the 44 kilohm output impedance has been found to be sufficiently low to drive an output stage having input impedance of 150 kilohms or more.

Those skilled in the art will recognize that resistor 41 in the cathode of tube 39, shown in FIGS. 5 and 8, and in the cathode of tube 39a as shown in FIG. 9 and also cathode follower load 41 shown in FIG. 7, may be omitted because the divider 33–35 itself provides a separate parallel path to ground for the cathode current of tube 39. Note that resistor 41 may not be omitted for the most general case of an invention embodiment as shown in FIG. 4, since not all possible direct current feedback networks include a separate parallel path to ground for the cathode current of tube 39.

The audio power amplifier input circuit of the invention described herein (FIGS. 4–9) has been found to improve overall amplifier performance. Distortion is reduced by about one-half, or 6 dB, while power output is increased by about 10%. The reduced distortion and greater power output are both attributed to the higher drive capability of the improved input circuit.

In addition, the direct current stability of the invention input circuit represents an improvement over prior art. Large variations in alternating current line voltage, i.e. from 105 to 129 volts, which cause a 20% change in unregulated filament and plate supply voltage, have little effect on amplifier performance. Tubes which have aged to their end-of-life point, defined as 50% of the new transconductance value, function as well as new tubes.

The above description shall not be construed as limiting the ways in which this invention may be practiced but shall be inclusive of many other variations that do not depart from the broad interest and intent of the invention.

I claim:

1. An audio power amplifier input circuit comprising in combination:

split load phase inverter circuit means (13, 19a, 19b, 19c, 19d, 47, 49) having a preferred direct current operating point and formed to have electrical current control means to regulate the electrical current passing therethrough;

voltage amplifier circuit means (45) including voltage output means, whose voltage value increases and alternatively decreases in response respectively to decreased and alternatively increased electrical current flow through said voltage amplifier circuit means, said voltage amplifier circuit means further having a current control means to regulate current passing therethrough;

direct current feedback circuitry means connected between said current control means of said split-load phase inverter circuit means (13, 19a, 19b, 19c, 19d, 47, 49) and both said voltage output means of said voltage amplifier circuit means as well as said current control means of said voltage amplifier circuit means (45) whereby when electrical current flowing through said voltage amplifier circuit means is reduced and alternatively increased, current flowing through said split-load phase inverter circuit means will respectively be increased and alternatively decreased to substantially maintain said preferred direct current operating point of said split-load phase inverter circuit means (13, 19a, 19b, 19c, 19d, 47, 49).

2. An audio power amplifier input circuit according to claim 1 wherein,
said split-load phase inverter (13, 19a, 19b, 19c, 19d, 47, 49) has first and second output means and wherein there is further included first and second transistor emitter follower circuits (47, 49) respectively connected to said first and second output means to cause said audio power amplifier input circuit to have a reduced output impedance.

3. An audio power amplifier input circuit according to claim 2 wherein,
said first and second transistor emitter follower circuits have common-emitter current gains of at least 50.

4. An audio power amplifier input circuit according to claim 1, wherein,
said direct current feedback circuitry means includes a triode vacuum tube means (39) whose grid is connected to said voltage output means of said voltage amplifier circuit means (45) and further includes a resistor network (35, 33) connected on a cathode follower load resistor (41) in the cathode circuit of said triode vacuum tube (39), said resistor network (35, 33) being further connected to said current control means of said voltage amplifier circuit means (45).

5. An audio power amplifier input circuit according to claim 4, wherein,
said voltage amplifier circuit means (45) comprises a dual triode vacuum tube circuit with at least one-half thereof having a plate resistor (29) to provide said voltage output means and further having a grid element to provide said current control means.

6. An audio power amplifier input circuit comprising in combination:
B+ and B− power supply means;
first triode vacuum tube means (13) having cathode, grid and plate elements and having a plate resistor (19a) and a cathode resistor (19b), said first triode vacuum tube means (13) connected between said B+ and B− power supply means, said first triode vacuum tube means (13) having a first output terminal disposed between said plate resistor (19a) and said plate element and a second output terminal disposed between said cathode resistor (19b) and said cathode element;
dual triode vacuum tube means (45) connected between said B+ and B− power supply means, with each half of said dual vacuum tube means having cathode, grid and plate elements, at least one-half of said dual triode vacuum tube means having a plate resistor (29) and a third output terminal disposed between said last mentioned plate resistor (29) and said last mentioned plate element;
second triode vacuum tube means (39), connected between said B+ and B− power supply means, having cathode, grid and plate element of said first triode vacuum tube means (39) having its grid element connected to said grid element of said first triode vacuum tube means (13) and to said third output terminal, said second triode vacuum tube means (39) including a cathode resistor (41) and a fourth output terminal disposed between said last mentioned cathode resistor (41) and said last mentioned cathode element;
resistor network means (35, 33) connected between said fourth output terminal and said grid element of said at least one-half of said dual triode vacuum tube means to provide a direct current feedback to said at least one-half of said dual triode vacuum tube means; and
first and second transistors (47, 49) with each having emitter, base and collector elements with the base elements of said first and second transistors (47, 49) respectively connected to said first and second output terminals, said emitter elements of said first and second transistors (47, 49) each having an emitter follower resistor (19c, 19d) therein with a fifth output terminal disposed between said first transistor emitter follower resistor (19c) and the first transistor emitter element and with a sixth output terminal disposed between said second transistor emitter follower resistor (19d) and the second transistor emitter element whereby a push-pull power output circuit may be connected to said fifth and sixth output terminals.

7. An audio power amplifier input circuit (57), comprising
an input terminal;
power supply B+ and B− terminals;
a voltage amplifier stage (45);
a split-load phase inverter stage (13, 19a, 19b,);
a pair of output terminals (15, 17);
a DC feedback network connected from said split-load phase inverter stage (13, 19a, 19b), to said voltage amplifier stage (45); and
a transistor emitter-follower having transistors (47, 49) and load resistors (19c, 19d) connected between said split-load phase inverter stage (13, 19a, 19b), and the output terminals (15, 17) of said audio power amplifier input circuit (57).

8. The audio power amplifier input circuit (57) of claim 7 wherein
the voltage amplifier stage (45) is a dual-triode vacuum tube (45) operating in the cascode connection.

9. The audio power amplifier input circuit (57) of claim 7 wherein
the transistors (47, 49) have common-emitter current gains of 50 or greater in order to reduce the output impedance of said input circuit (57).

10. The audio power amplifier input circuit (57) of claim 7 wherein
the voltage amplifier stage is a pentode vacuum tube (31).

11. The audio power amplifier input circuit (57) of claim 7 wherein
the transistors (47, 49) are replaced by field-effect transistors.

12. The audio power amplifier input circuit (57) of claim 7 wherein
the transistor emitter follower is replaced by a vacuum tube cathode follower.

13. An audio power amplifier input circuit (57), consisting of
and input terminal;
a B+ terminal for connection to a power supply;
a B− terminal for connection to a grounded terminal of power supply;
a first resistor: (21) connected to said input terminal, with other terminal of said first resistor (21) being grounded;

a first triode vacuum tube (45a), with the grid of said first triode vacuum tube (45a) connected to said input terminal, the cathode of said first triode vacuum tube (45a) connected to one end of a second resistor (27) with said other terminal of said second resistor (27) grounded, the plate of said first vacuum tube (45a) connected to the cathode of a second vacuum tube (45b);

the plate of said second vacuum tube (45b) connected to the grids of third (39) and fourth (13) vacuum tubes;

a third resistor (29) connected to the plate of said second vacuum tube (45b) with said other terminal of said third resistor (29) connected to the B+ power supply voltage;

a fourth resistor (41) connected to the cathode of said third vacuum tube (39) with said other terminal of said fourth resistor (41) grounded;

a fifth resistor (35) connected to the cathode of said third vacuum tube (39);

said other terminal of said fifth resistor (35) connected to the grid of said second vacuum tube (45b);

a sixth resistor (33) connected to the grid of said second vacuum tube (45b) with said other terminal of said sixth resistor (33) being grounded;

a capacitor (23) connected to the grid of said second vacuum tube (45b) with said other terminal of said capacitor (23) grounded;

a seventh resistor (19a) connected to the plate of said fourth vacuum tube (13) with said other terminal of said seventh resistor (19a) connected the B+ supply voltage;

an eighth resistor (19b) connected to the cathode of said fourth vacuum tube (13) with said other terminal of said eighth resistor (19b) grounded;

the plate of said fourth vacuum tube (13) connected to the base of a first transistor (47);

the cathode of said fourth vacuum tube (13) connected to the base of a second transistor (49);

a ninth resistor (19c) connected to the emitter of said first transistor (47) with said other terminal of said ninth (19c) resistor connected to the B+ supply voltage;

a tenth resistor (19d) connected to the emitter of said second transistor (49) with said other terminal of said tenth resistor (19d) grounded;

a collector of said first transistor (47) grounded;

a collector of said second transistor (49) connected to the B+ supply voltage;

an emitter of said first transistor (47) connected to a first output terminal (15); and an emitter of said second transistor (49) connected to a second output terminal (17).

* * * * *